(12) United States Patent
Ishiguro

(10) Patent No.: US 8,580,651 B2
(45) Date of Patent: Nov. 12, 2013

(54) METHODS FOR MANUFACTURING A TRENCH TYPE SEMICONDUCTOR DEVICE HAVING A THERMALLY SENSITIVE REFILL MATERIAL

(75) Inventor: Takeshi Ishiguro, Fukushima-ken (JP)

(73) Assignee: Icemos Technology Ltd., Belfast, Northern Ireland (GB)

( * ) Notice: Subject to any disclaimer, the term of this patent is extended or adjusted under 35 U.S.C. 154(b) by 786 days.

(21) Appl. No.: 11/962,523

(22) Filed: Dec. 21, 2007

(65) Prior Publication Data

US 2008/0258239 A1  Oct. 23, 2008

Related U.S. Application Data

(60) Provisional application No. 60/913,432, filed on Apr. 23, 2007.

(51) Int. Cl.
*H01L 21/762* (2006.01)

(52) U.S. Cl.
USPC ............. 438/433; 438/561; 257/E21.551

(58) Field of Classification Search
None
See application file for complete search history.

(56) References Cited

U.S. PATENT DOCUMENTS

| | | |
|---|---|---|
| 3,404,295 A | 10/1968 | Warner, Jr. |
| 3,497,777 A | 2/1970 | Teszner |
| 3,564,356 A | 2/1971 | Wilson |
| 4,158,206 A | 6/1979 | Neilson |
| 4,211,582 A | 7/1980 | Horng et al. |
| 4,238,278 A | 12/1980 | Antipov |
| 4,491,486 A | 1/1985 | Iwai |
| 4,754,310 A | 6/1988 | Coe |
| 4,775,881 A | 10/1988 | Ploog et al. |
| 4,821,095 A | 4/1989 | Temple |
| 4,866,004 A | 9/1989 | Fukushima |
| 4,868,624 A | 9/1989 | Grung et al. |
| 4,895,810 A | 1/1990 | Meyer et al. |
| 4,994,406 A | 2/1991 | Vasquez et al. |
| 5,019,522 A | 5/1991 | Meyer et al. |
| 5,027,180 A | 6/1991 | Nishizawa et al. |
| 5,045,903 A | 9/1991 | Meyer et al. |
| 5,105,243 A | 4/1992 | Nakagawa et al. |
| 5,216,275 A | 6/1993 | Chen |
| 5,218,226 A | 6/1993 | Slatter et al. |

(Continued)

FOREIGN PATENT DOCUMENTS

| | | |
|---|---|---|
| JP | 52-038889 A | 3/1977 |
| WO | 2005001941 A3 | 1/2005 |
| WO | 2005031880 A1 | 4/2005 |

OTHER PUBLICATIONS

Chenming Hu; Optimum Doping Profile for minimum Ohmic Resistance and High-Breakdown Voltage; IEEE Transactions on Electron Devices, vol. ED-26, No. 3, pp. 243-244; Mar. 1979.

(Continued)

*Primary Examiner* — Benjamin Sandvik
(74) *Attorney, Agent, or Firm* — Panitch Schwarze Belisario & Nadel LLP

(57) ABSTRACT

Methods for manufacturing trench type semiconductor devices involve refilling the trenches after high temperature processing steps are performed. The methods allow thermally unstable materials to be used as refill materials for the trenches of the device. Trench type semiconductor devices containing thermally unstable refill materials are also provided. In particular, methods of manufacturing and devices of a trench type semiconductor devices containing organic refill materials are provided.

17 Claims, 3 Drawing Sheets

(56) References Cited

U.S. PATENT DOCUMENTS

| | | |
|---|---|---|
| 5,219,777 A | 6/1993 | Kang |
| 5,366,914 A | 11/1994 | Takahashi et al. |
| 5,389,815 A | 2/1995 | Takahashi |
| 5,395,790 A | 3/1995 | Lur |
| 5,418,376 A | 5/1995 | Muraoka et al. |
| 5,430,311 A | 7/1995 | Murakami et al. |
| 5,432,113 A | 7/1995 | Tani |
| 5,435,888 A | 7/1995 | Kalnitsky et al. |
| 5,438,215 A | 8/1995 | Tihanyi |
| 5,472,888 A | 12/1995 | Kinzer |
| 5,506,421 A | 4/1996 | Palmour |
| 5,510,287 A | 4/1996 | Chen et al. |
| 5,519,245 A | 5/1996 | Tokura et al. |
| 5,572,048 A | 11/1996 | Sugawara |
| 5,598,018 A | 1/1997 | Lidow et al. |
| 5,726,469 A | 3/1998 | Chen |
| 5,742,087 A | 4/1998 | Lidow et al. |
| 5,744,994 A | 4/1998 | Williams |
| 5,786,619 A | 7/1998 | Kinzer |
| 5,902,127 A | 5/1999 | Park |
| 5,926,713 A | 7/1999 | Hause et al. |
| 5,929,690 A | 7/1999 | Williams |
| 5,939,754 A | 8/1999 | Hoshi |
| 5,998,292 A | 12/1999 | Black et al. |
| 6,008,106 A | 12/1999 | Tu et al. |
| 6,011,298 A | 1/2000 | Blanchard |
| 6,066,878 A | 5/2000 | Neilson |
| 6,081,009 A | 6/2000 | Neilson |
| 6,097,072 A * | 8/2000 | Omid-Zohoor ............... 257/397 |
| 6,174,773 B1 | 1/2001 | Fujishima |
| 6,184,555 B1 | 2/2001 | Tihanyi et al. |
| 6,190,970 B1 | 2/2001 | Liao et al. |
| 6,198,127 B1 | 3/2001 | Kocon |
| 6,214,698 B1 | 4/2001 | Liaw et al. |
| 6,222,229 B1 | 4/2001 | Hebert et al. |
| 6,239,463 B1 | 5/2001 | Williams et al. |
| 6,265,281 B1 | 7/2001 | Reinberg |
| 6,291,856 B1 | 9/2001 | Miyasaka et al. |
| 6,300,171 B1 | 10/2001 | Frisina |
| 6,307,246 B1 | 10/2001 | Nitta et al. |
| 6,309,929 B1 | 10/2001 | Hsu et al. |
| 6,310,365 B1 | 10/2001 | Chen |
| 6,359,309 B1 | 3/2002 | Liao et al. |
| 6,362,505 B1 | 3/2002 | Tihanyi |
| 6,391,723 B1 | 5/2002 | Frisina |
| 6,406,975 B1 | 6/2002 | Lim et al. |
| 6,410,958 B1 | 6/2002 | Usui et al. |
| 6,426,991 B1 | 7/2002 | Mattson et al. |
| 6,452,230 B1 | 9/2002 | Boden, Jr. |
| 6,459,124 B1 | 10/2002 | Zhang et al. |
| 6,465,325 B2 | 10/2002 | Ridley et al. |
| 6,495,421 B2 | 12/2002 | Luo |
| 6,501,130 B2 | 12/2002 | Disney |
| 6,501,146 B1 | 12/2002 | Harada |
| 6,504,230 B2 | 1/2003 | Deboy et al. |
| 6,509,220 B2 | 1/2003 | Disney |
| 6,512,267 B2 | 1/2003 | Kinzer et al. |
| 6,534,367 B2 | 3/2003 | Peake et al. |
| 6,566,201 B1 | 5/2003 | Blanchard |
| 6,613,644 B2 | 9/2003 | Lachner |
| 6,624,494 B2 | 9/2003 | Blanchard et al. |
| 6,635,906 B1 | 10/2003 | Chen |
| 6,686,244 B2 | 2/2004 | Blanchard |
| 6,710,400 B2 | 3/2004 | Blanchard |
| 6,710,403 B2 | 3/2004 | Sapp |
| 6,710,418 B1 | 3/2004 | Sapp |
| 6,713,813 B2 | 3/2004 | Marchant |
| 6,762,473 B1 | 7/2004 | Goushcha et al. |
| 6,787,872 B2 | 9/2004 | Kinzer |
| 6,797,589 B2 | 9/2004 | Adams et al. |
| 6,853,033 B2 * | 2/2005 | Liang et al. ................. 257/339 |
| 6,936,867 B2 | 8/2005 | Chen |
| 6,936,907 B2 | 8/2005 | Chen |
| 6,998,681 B2 | 2/2006 | Chen |
| 7,015,104 B1 | 3/2006 | Blanchard |
| 7,023,069 B2 | 4/2006 | Blanchard |
| 7,041,560 B2 | 5/2006 | Hshieh |
| 7,052,982 B2 | 5/2006 | Hshieh et al. |
| 7,109,110 B2 | 9/2006 | Hsieh |
| 7,224,022 B2 * | 5/2007 | Tokano et al. ............... 257/328 |
| 7,948,033 B2 * | 5/2011 | Hossain ....................... 257/342 |
| 2002/0070418 A1 | 6/2002 | Kinzer et al. |
| 2005/0176192 A1 | 8/2005 | Hsieh |
| 2005/0181564 A1* | 8/2005 | Hshieh et al. ................ 438/270 |
| 2005/0250257 A1* | 11/2005 | Hossain et al. ............... 438/135 |
| 2006/0197151 A1* | 9/2006 | Kobayashi et al. ........... 257/341 |
| 2006/0249786 A1* | 11/2006 | Moens et al. ................. 257/328 |

OTHER PUBLICATIONS

P. Rossel; Power M.O.S. Devices; Microelectron, Reliab., vol. 24, No. 2, pp. 339-366; 1984.

Victor A.K. Temple et al.; A 600-Volt MOSFET Designed for Low On-Resistance; IEEE Transactions on Electron Devices, vol. ED-27, No. 2, pp. 343-349; Feb. 1980.

Xing-Bi Chen et al.; Optimum Doping Profile of Power MOSFET; IEEE Transactions on Electron Devices, vol. ED-29, No. 6, pp. 985-987; Jun. 1982.

U.S. Appl. No. 12/031,895, Takeshi Ishiguro.
U.S. Appl. No. 11/962,530, Takeshi Ishiguro.
U.S. Appl. No. 12/031,909, Takeshi Ishiguro.
U.S. Appl. No. 12/029,857, Takeshi Ishiguro.

* cited by examiner

METHODS FOR MANUFACTURING A TRENCH TYPE SEMICONDUCTOR DEVICE HAVING A THERMALLY SENSITIVE REFILL MATERIAL

CROSS REFERENCE TO RELATED APPLICATIONS

This application claims priority to U.S. Provisional Patent Application No. 60/913,432, filed on Apr. 23, 2007, entitled "Methods of Manufacturing A Trench Type Semiconductor Device Having a Thermally Sensitive Refill Material."

BACKGROUND OF THE INVENTION

Embodiments of the present invention relate to a semiconductor device and a method for manufacturing a semiconductor device. In particular, embodiments of the present invention relate to methods for manufacturing a trench type semiconductor device having a thermally sensitive refill material.

Since the invention of superjunction devices by Dr. Xingbi Chen, as disclosed in U.S. Pat. No. 5,216,275, the contents of which are incorporated by reference herein, there have been many attempts to expand and improve on the superjunction effect of his invention. U.S. Pat. Nos. 6,410,958, 6,300,171 and 6,307,246 are examples of such efforts and are incorporated herein by reference.

Trench type superjunction devices are expected to replace multi-epi superjunction devices because of the potential lower processing cost. To manufacture a trench type superjunction device, insulator material is required to refill one or more of the etched trenches. The refill material should be selected carefully because the material impacts the electrical characteristics and reliability of the superjunction device. Generally, thermally stable materials, such as epitaxy, Tetraethylorthosilicate (TEOS), polysilicon, or semi-insulating polysilicon, have been used as the refill material.

Organic materials, which have low thermal expansion and provide good coverage, such as polyimide, are desirable candidates for the refill material. The melted organic refill materials generally have lower viscosity. Thus, internal voids in the refill material are less likely to occur during the refill process as compared to the conventional inorganic refill materials. In addition, the trenches may be filled with an organic refill material using technically less demanding methods, such as surface reflow methods. Furthermore, devices having organic refill materials are expected to have more stable surface potential at the breakdown voltage. Despite these advantages, thermally sensitive organic materials have not been used as a refill material for a trench type superjunction device because they are thermally unstable at a temperature significantly lower than the temperature used in the semiconductor diffusion processes employed in a conventional manufacturing method.

Therefore, it is desirable to provide a method for manufacturing a trench type semiconductor device having thermally sensitive refill materials, and a trench type semiconductor device having thermally sensitive refill materials.

BRIEF SUMMARY OF THE INVENTION

In one general aspect, an embodiment of the present invention includes a method of manufacturing a trench type semiconductor device. In certain embodiments, a terminal structure of the device is provided before refilling a trench of the device. A semiconductor substrate having first and second main surfaces opposite to each other is provided. The semiconductor substrate has a heavily doped region of a first conductivity type at the second main surface and has a lightly doped region of the first conductivity type at the first main surface. A terminal structure is fabricated at the first main surface side. A mesa and a trench are formed in the semiconductor substrate extending from the first main surface, with the terminal structure disposed generally over the mesa. The mesa is adjacent the trench and has a first sidewall surface and a second sidewall surface. The method further includes doping, with a dopant of a second conductivity type, the first sidewall surface to form a first doped region of the second conductivity type and doping, with a dopant of a second conductivity type, the second sidewall surface to form a second doped region of the second conductivity type. After the doping steps, the trench is filled with a semi-insulating material and/or an insulating material.

In more preferred embodiments of, a semi-insulating material and/or an insulating material that is thermally unstable at a temperature of about 800° C. and above, or more particularly a semi-insulating material and/or an insulating material that is thermally unstable at a temperature of about 450° C. and above, is used to manufacture a trench type semiconductor device.

In another general aspect, an embodiment of the present invention comprises a method of manufacturing a trench type semiconductor device. A refill material that is thermally unstable at a temperature of about 800° C. and above is generally considered. A semiconductor substrate having first and second main surfaces opposite to each other is provided. The semiconductor substrate has a heavily doped region of a first conductivity type at the second main surface and has a lightly doped region of the first conductivity type at the first main surface. A terminal structure is formed at the first main surface side. A mesa and a trench are formed in the semiconductor substrate extending from the first main surface, with the terminal structure disposed generally over the mesa. The mesa is adjacent to the trench and has a first sidewall surface and a second sidewall surface. The method further includes doping with a dopant of a second conductivity type into the first sidewall surface to form a first doped region of the second conductivity type and doping with a dopant of a second conductivity type into the second sidewall surface to form a second doped region of the second conductivity type. After the doping steps, the trench is filled with a semi-insulating material and/or an insulating material that is thermally unstable at a temperature of about 800° C. and above.

In a preferred embodiment, a trench type semiconductor device is provided that has a trench filled with a semi-insulating material and/or an insulating material that is thermally unstable at a temperature of about 800° C. and above.

In certain preferred embodiments, the semi-insulating material and/or the insulating material is an organic material.

In further preferred embodiments, the trench type semiconductor device is a trench type superjunction device.

Other aspects, features and advantages will be apparent from the following disclosure, including the detailed description, preferred embodiments, and the appended claims.

BRIEF DESCRIPTION OF SEVERAL VIEWS OF THE DRAWINGS

The foregoing summary, as well as the following detailed description of preferred embodiments of the invention, will be better understood when read in conjunction with the appended drawings. For purposes of illustration, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
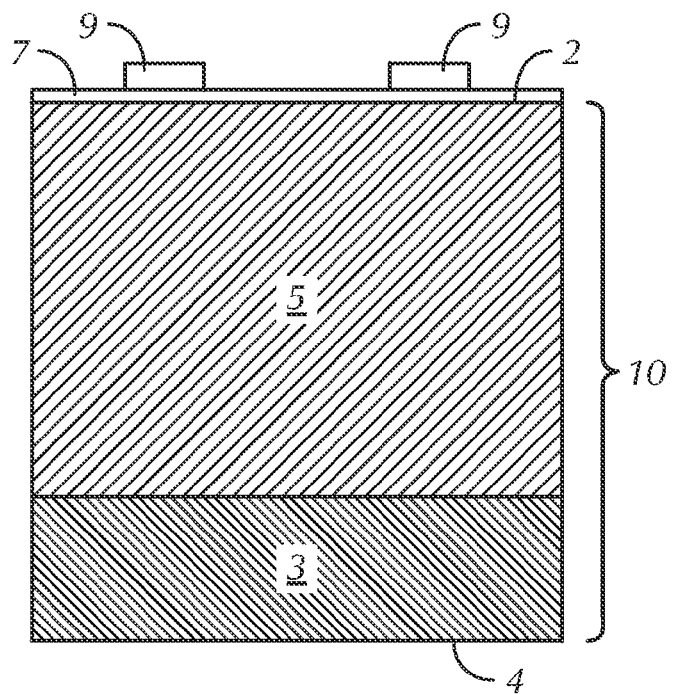
FIG. 1 is an enlarged partial cross-sectional view of a semiconductor substrate after formation of a gate insulating layer and a gate electrode.

For simplicity and clarity of illustration, elements in the figures are not necessarily to scale, and the same reference numbers in different figures denote the same elements. For clarity of the drawing, devices, trenches, mesas, and the doped regions of device structures are illustrated as having generally straight line edges and precise angular corners. However, those skilled in the art understand that the edges need not be straight lines and the corners need not be precise angles.

Certain terminology is used in the following description for convenience only and is not limiting. The words "right", "left", "lower", and "upper" designate directions in the drawing to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, it must be noted that as used herein and in the appended claims, the singular forms "a," "an," and "the" include plural reference unless the context clearly dictates otherwise.

Although any embodiment of the present invention may refer to a particular conductivity (e.g., p-type or n-type), it will be readily understood by those skilled in the art that p-type conductivity can be switched with n-type conductivity and vice versa and the device will still be functionally correct (i.e., a first or second conductivity type). For example, metal oxide semiconductor field effect transistor (MOSFET)-gated devices and insulated gate bipolar transistors (IGBTs) can be fabricated in an epitaxial wafer with an n-type epitaxial layer over a $p^+$ substrate (or vice versa).

An n-type semiconductor includes any semiconductor obtained by n-type doping process, i.e., by adding an impurity (dopant) to a semiconductor, in order to increase the number of free electrons in the material. For example, an n-type semiconductor can be obtained by incorporating phosphorus (P), arsenic (As), or antimony (Sb), into silicon. The n-type semiconductor can be heavily doped ($n^+$), very heavily doped ($n^{++}$), lightly doped ($n^-$), or very lightly doped ($n^{--}$). The level of doping of the n-type semiconductor is directly proportional to the carrier concentration.

A p-type semiconductor includes any semiconductor obtained by p-type doping process, i.e., by adding an impurity (dopant) to a semiconductor, in order to increase the number of free holes in the material. For example, a p-type semiconductor can be obtained by incorporating boron (B) or aluminum (Al) into silicon. The p-type semiconductor can be heavily doped ($p^+$), very heavily doped ($p^{++}$), lightly doped ($p^-$), or very lightly doped ($p^{--}$). The level of doping of the p-type semiconductor is proportional to the carrier concentration.

Doping in accordance with various embodiments of the present invention can be carried out using any method or equipment known or to be developed for imparting impurities of either n-type or p-type into another material, including, for example, ion implantation and in-situ vapor deposition techniques.

As used herein, an "organic material" refers to a material comprising an organic compound. An organic compound can be any member of a large class of chemical compounds the molecules of which contain carbon and hydrogen. An organic compound may also contain any number of other elements, such as nitrogen, oxygen, halogens, phosphorous, sulfur, or the like.

As used herein, a material is "thermally unstable" or "thermally sensitive" when a physical property of the material is changed under the influence of heat. The change in physical property of the material under the influence of heat can be, for example, melting, boiling, sublimating, or decomposing. An organic compound typically becomes thermally unstable at a temperature much lower than the temperature at which an inorganic compound becomes thermally unstable.

As used herein, the term "terminal structure" refers to a structure that contains any one or more of the structures involved in a terminal for a semiconductor device. The "terminal structure" can be, for example, an electrode that is connected to the semiconductor device, such as a gate electrode, a source electrode, or a drain electrode. The "terminal structure" can also be, for example, a doped region in the semiconductor substrate that is in close proximity or adjacent to an electrode connected to the semiconductor device. Examples of such doped regions, include, but are not limited to, a body region, a body contact region, and a source region. The "terminal structure" can be a combination of any one or more of the electrodes and the doped regions. In one embodiment of the present invention, the "terminal structure" comprises a gate electrode, a body region, a body contact region, a source region and a source electrode.

The device according to embodiments of the present invention can embody either a cellular design (where the body regions are a plurality of cellular regions) or a single body design (where the body region includes a single region formed in an elongated pattern, typically in a serpentine pattern). Although the device will be described as a cellular design throughout the following description for ease of understanding, it should be understood that it is intended that embodiments of the present invention encompass a cellular design, a single body design, or combinations thereof. By way of example, a device according to embodiments of the present invention is among many such devices integrated with logic and/or other components into a semiconductor chip as part of a power integrated circuit. Alternatively, a device according to embodiments of the present invention is among many such devices integrated together to form a discrete transistor device.

In a conventional manufacturing process for a trench type superjunction device, the trenches are generally refilled before several high temperature steps. For example, the trenches are generally filled before forming a terminal structure, which may involve processes performed at about 800-1000° C., including, but not limited to, gate electrode formation, body p diffusion, body contact p diffusion, and source n diffusion. Prior art refill materials used to fill the trenches prior to the high temperature processes were therefore required to be thermally stable at about 800-1000° C. However, most of the usable organic materials are thermally unstable at a temperature of about 800° C. and above. Thus, such organic material cannot be used as refill material in the conventional or prior art processes.

In one general aspect, embodiments of the present invention provide methods of manufacturing a trench type semiconductor device that involves at least partially forming a terminal structure prior to the steps of trench etching, doping, and refilling. Accordingly, the refill material is filled within the trenches after the high temperature processes involved in terminal structure formation are completed. Therefore, a thermally unstable refill material, such as an organic material, may be used as well as a thermally stable refill material.

Referring to FIG. 1, which is an enlarged partial cross-sectional view of a semiconductor substrate 10 after formation of a gate insulating layer and a gate electrode in accordance with a preferred embodiment of the present invention, the semiconductor substrate 10 has two main surfaces 2 and 4 opposite to each other. The semiconductor substrate 10 includes a substrate region 3 including surface 4 and a semiconductor material layer 5 including surface 2. Semiconductor substrate materials suitable for use in the device embodiments of the present invention include, but are not limited to, various semiconducting materials such as silicon, germanium, arsenides, antimonides and/or phosphides of gallium and/or indium, and combinations thereof.

In various embodiments, the semiconductor substrate 10 can comprise a silicon wafer. Silicon wafers can be prepared via standard techniques to prepare a suitable substrate. For example, suitable wafers may be prepared via a process wherein silicon is grown from a small crystal, called the seed crystal, rotated and slowly withdrawn from molten hyperpure silicon to give a cylindrical crystal, which is then sliced to obtain thin disks, which after slicing, are finely ground, mirror-smooth polished and cleaned. Silicon wafers suitable for use as a semiconductor material layer in various embodiments of the present invention can be undoped, or doped with either p-type or n-type conductivity, either heavily or lightly.

In certain preferred embodiments, the substrate region 3 and the semiconductor material layer 5 are both doped with a dopant of the same conductivity type. Generally, in such preferred embodiments, the substrate region 3 is doped at a level greater than the semiconductor material layer 5. For example, in embodiments wherein the substrate region 3 comprises a silicon wafer doped with n-type conductivity and the semiconductor material layer 5 comprises epitaxial silicon which is lightly n-type doped, the level of doping in the substrate region can be about $1\times10^{17}$ $cm^{-3}$ to about $1\times10^{20}$ $cm^{-3}$, and the level of doping in the semiconductor material layer 5 can be about $7\times10^{13}$ $cm^{-3}$ to about $5\times10^{15}$ $cm^{-3}$.

In certain preferred embodiments of the present invention, the semiconductor material layer 5 comprises epitaxial silicon, which refers to single crystal silicon grown over a substrate, usually via chemical vapor deposition (CVD). Epitaxially grown silicon deposited using CVD can be doped during formation with a high degree of control. Accordingly, lightly doped silicon 5 can be deposited over a silicon substrate 3. In certain embodiments of the present invention, the semiconductor layer 5 comprises epitaxial silicon doped with a dopant of a first conductivity, as shown in FIG. 1, n-type conductivity, at a level of about $7\times10^{13}$ $cm^{-3}$ to about $5\times10^{15}$ $cm^{-3}$. In certain preferred embodiments according to the present invention, the semiconductor layer 5 comprises epitaxial silicon doped with n-type conductivity at a level of about $1\times10^{14}$ $cm^{-3}$ to about $2\times10^{14}$ $cm^{-3}$. Any suitable epitaxial deposition apparatus known or to be developed can be used to form an epitaxial semiconductor material layer suitable for use in the embodiments of the present invention. In an exemplary embodiment, layer 5 has a thickness on the order of about 40 to about 50 microns for a 600 V device. The thickness of layer 5 is increased or decreased depending on the desired breakdown voltage rating of the device.

A gate insulating layer 7 is either grown or deposited on the top surface 2 of the epitaxial layer 5. Gate electrodes 9 are formed over the insulating layer 7. In an exemplary embodiment, the gate insulating layer 7 includes silicon dioxide, and has a thickness of about 0.05 microns to about 0.1 microns. In alternative embodiments, gate insulating layer 7 includes silicon oxynitride, or the like. The gate electrodes 9 can be composed of, for example, a layer of metal, doped or undoped polysilicon, amorphous silicon, or a combination thereof.

Figure 2:
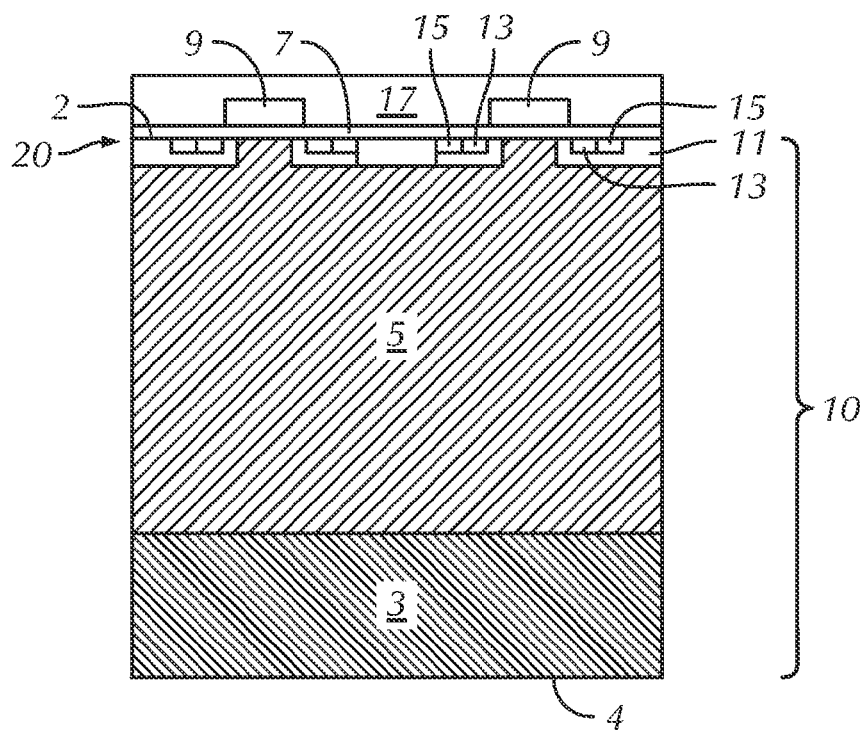
FIG. 2 is an enlarged partial cross-sectional view of the semiconductor substrate after formation of a terminal structure for a MOSFET device.

FIG. 2 is an enlarged partial cross-sectional view of the semiconductor substrate 10 after a terminal structure 20 is formed for a MOSFET device. A body or doped region 11 is formed in semiconductor layer 5 between and in proximity or adjacent to the gates 9, and extends from the main surface 2. In an exemplary embodiment, body region 11 comprises p-type conductivity, having a dopant concentration suitable for forming an inversion layer that operates as conduction channels of the device, and extends from main surface 2 to a depth of about 1.0 to about 5.0 microns. A source region 13 is formed within or in body region 11 and extends from the main surface 2. In an exemplary embodiment, source region 13 comprises n-type conductivity, having a dopant concentration suitable to provide a low contact resistance with a source electrode (not shown) at the main surface 2, and extends from the main surface 2 to a depth of about 0.2 microns to about 0.5 microns.

The source region 13 is in proximity to gate electrodes 9. A body contact region 15 is also formed in body region 11 adjacent to the source region 13 and extending from the main surface 2. In an exemplary embodiment, the body contact region 15 comprises p-type conductivity, having a dopant concentration suitable to provide a lower contact resistance than the body region 11 at main surface 2. The body contact region 15 extends from the main surface 2 to a depth of about 0.2 microns to about 0.5 microns. In exemplary embodiments, to form the p body region 11, p body contact 15, or the n source region 13, p-type dopant or n-type dopant is ion implanted into the semiconductor layer 5 through the oxide layer 7 at an energy level of about 30-1000 kilo-electron-volts (KeV) with a dose range from about $1\times10^{10}$ to about $1\times10^{16}$ atoms $cm^{-2}$, followed by a high temperature drive-in step (i.e., a diffusion).

An interlayer dielectric (ILD) deposition 17 is then deposited over the gate electrodes 9 and over the main surface 2 with the body region 11, the body contact 15 and the source 13. In an exemplary embodiment, the ILD layer 17 is a deposited silicon oxide about 0.8 to about 3 microns in thickness.

Figure 3:
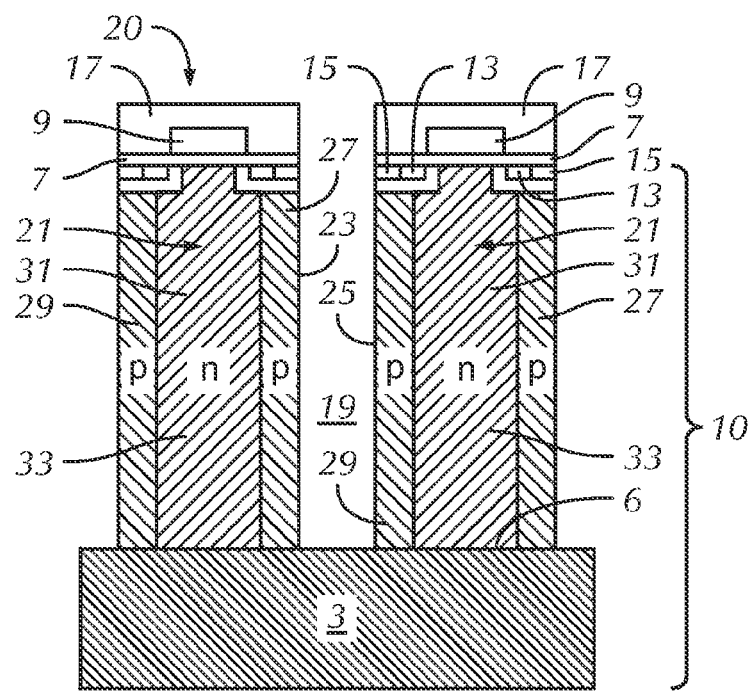
FIG. 3 is an enlarged partial cross-sectional view of the semiconductor substrate after formation of trenches and p column diffusions.

FIG. 3 is an enlarged partial cross-sectional view of the semiconductor substrate 10 after trenches and p column diffusions are formed. One or more trenches 19 are formed in layer 5 extending from the main surface 2 to touch, to approach, or to penetrate the interface 6 between the heavily doped n$^+$ substrate region 3 and the epitaxial semiconductor layer 5. Note however, trenches 19 are not required to touch or to approach the interface 6. Trenches 19 can be formed only in layer 5 extending from the main surface 2 to any depth position desirable. Each of the trenches 19 is adjacent to an adjoining mesa 21. Many geometrical arrangements of trenches 19 and mesas 21 (i.e., in plan view) are contemplated without departing from the invention. The shape of the trenches 19 is not limited to being rectangular. Many other possible trench shapes such as dog-bones, rectangles with rounded ends, or crosses are also possible. The number and locations of the trenches 19 may affect overall device efficiency. In an exemplary embodiment for a MOSFET, the opening of trench 19 at the main surface 2 is located within a body region 11, and between or adjacent to body contact region 15.

Preferably, the trenches 19 are formed by utilizing known techniques such as plasma etching, reactive ion etching (RIE), sputter etching, vapor phase etching, chemical etching, deep RIE or the like. Utilizing deep RIE, trenches 19 can be formed having depths of about 40 μm to about 300 μm or even deeper. Deep RIE technology permits deeper trenches 19 with straighter sidewalls. Furthermore, forming deeper trenches 19 that have straighter sidewalls than conventionally etched or formed trenches 19, in addition to other steps in the process, results in a final superjunction device with enhanced avalanche breakdown voltage ($V_b$) characteristics as compared to conventional semiconductor-transistor devices (i.e., the avalanche breakdown voltage ($V_b$) can be increased to about 200 to 1200 Volts or more).

The sidewalls of each trench 19 can be smoothed, if needed, using, for example, one or more of the following process steps: (i) an isotropic plasma etch may be used to remove a thin layer of silicon (typically 100-1000 Angstroms) from the trench surfaces or (ii) a sacrificial silicon dioxide layer may be grown on the surfaces of the trench and then removed using an etch such as a buffered oxide etch or a diluted hydrofluoric (HF) acid etch. The use of the smoothing techniques can produce smooth trench surfaces with rounded corners while removing residual stress and unwanted contaminates. However, in the embodiments where it is desirable to have vertical sidewalls and square corners, an anisotropic etch process may be used instead of the isotropic etch process discussed above. Anisotropic etching, in contrast to isotropic etching, generally means different etch rates in different directions in the material being etched.

A first sidewall surface 23 and a second sidewall surface 25 of each of the trenches 19 in about parallel alignment with each other are implanted or doped with a p dopant such as boron (P) using any techniques known in the art. Preferably, the implants are performed without benefits of a masking step, e.g., at a implantation angle Φ (not shown) determined by the width and the depth of the trenches 19, at a high energy level in the range of about 40 Kilo-electron-volts (KeV) to several Mega-eV. Preferably, the energy level is in the range of about 200 KeV to 1 MeV, but it should be recognized that the energy level should be selected to sufficiently implant the dopant. The use of the predetermined implantation angle Φ ensures that only the sidewalls 23, 25 of the trenches 19 and not the bottoms of the trenches 19 are implanted. The implantation angle Φ can be between about 2° and 12° from vertical and is preferably about 4°.

Though not shown clearly, in some embodiments the trenches 19 are preferably slightly wider at their tops by about 1%-10% than at their bottoms to facilitate the trench fill process when the trenches 19, for example, are to be filled with grown oxide. Consequently, the trenches 19 have a first sidewall surface 23 with a predetermined inclination maintained relative to the first main surface 2 and a second sidewall surface 25 with a predetermined inclination maintained relative to the first main surface 2. The inclination of the first sidewall surface 23 is about the same as the inclination of the second sidewall surface 25 depending on tolerances of the etching process. Other doping techniques may be utilized.

Following implanting the p-type implant on both sidewall surfaces 23, 25, a drive-in step (i.e., a diffusion) is performed using any known techniques to create p-type doped regions 27, and 29, respectively. Preferably, a temperature and a time period for the drive-in step are selected to sufficiently drive in the implanted dopant into the mesas 21, while maintaining the structural integrity of the terminal structure 20. Because the source region 13 and the body contact region 15 must be relatively shallow, the drive-in step should not be performed at high temperatures for an extended duration in order to avoid undesirable effects on the preformed source region 13 and the preformed body contact region 15. The diffusion process is optimized for the electrical characteristics of the particular end product device. In an exemplary embodiment, the drive-in step is performed at a temperature of 900° C. for about 1 hour. After the drive-in step, the mesas 21 adjacent to two trenches 19 are converted to pnp columns 31, comprising the p columns 27 and 29 and the n columns 33. The n columns 33 have the same carrier concentration as that of epitaxial layer 5.

In another exemplary embodiment, the sidewall surfaces of the trenches, 23 and 25, can be additionally doped with an n-type dopant at a carrier concentration higher than that of layer 5 using methods similar to that described above for doping the p type column, or other methods known in the art.

An oxidation step, usually performed in a steam or oxygen ambient, can also be performed with or subsequent to the drive-in step, which forms a silicon dioxide layer (not shown) on the sidewalls 23, 25 and the bottoms of the trenches 19. A thin layer of silicon nitride (not shown) can also be deposited on the sidewalls 23, 25 and the bottoms of the trenches 19. Deposition of silicon nitride on thermally oxidized silicon wafers does not influence the fundamental properties of the Si—SiO$_2$ interface. The existence of silicon nitride makes surface potential stable or unstable according to the structures, partly due to the existence of hydrogen in silicon nitride. Hydrogen can influence electric properties. The layer of silicon nitride also serves to isolate and protect the silicon and silicon oxide in the pnp columns 31 from the refill material to be filled in trenches 19.

The lining of the trenches 19 with silicon nitride may be performed in general by CVD (thermal or plasma). The lining of the trenches 19 with silicon dioxide can be performed in general by CVD (thermal, plasma, or spun-on-glass (SOG)). Preferably, the lining of the trenches 19 with silicon dioxide and/or silicon nitride can be preferably performed using tetraethylorthosilicate (TEOS) because of the better conformity achieved by TEOS. Preferably, the silicon nitride is about 100 Å to about 10,000 Å thick (1 μm=10,000 Å).

Figure 4:
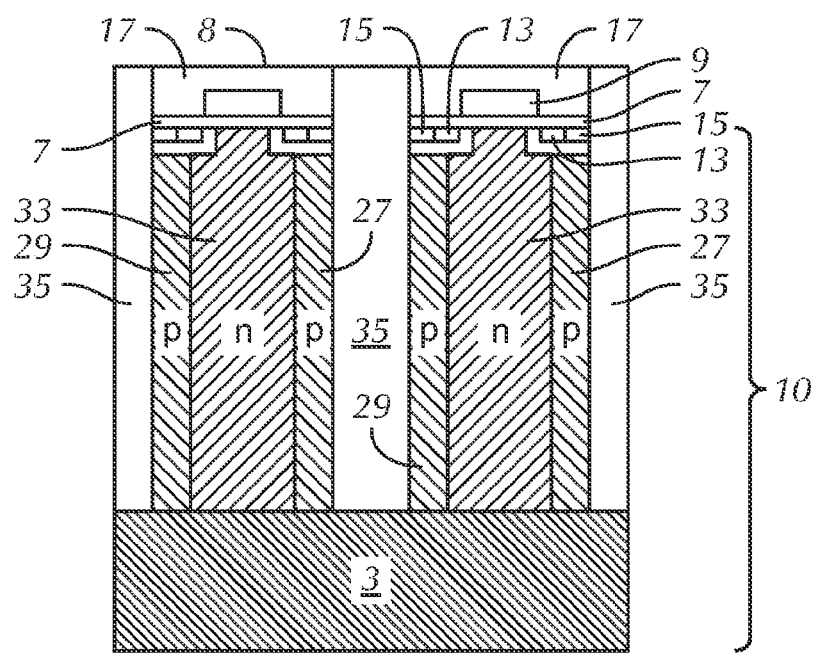
FIG. 4 is an enlarged partial cross-sectional view of the semiconductor substrate after trench refill and planarization.

FIG. 4 is an enlarged partial cross-sectional view of the semiconductor substrate 10 after trench refill and planarization. After dopant implantation and diffusion to form the doped columns 31, the trenches 19 are filled with a material 35 such as a semi-insulating material, an insulating material, or a combination thereof. Because no process at a temperature over 800° C. will be performed after trench refill, materials that are thermally stable or unstable at a temperature of 800° C. and above can be used as the refill materials 35. Thermal processes, such as CVD, metal sputtering, and metal sintering, can be performed after the implantation and diffusion steps in FIG. 3. These thermal processes are in general performed at a temperature of about 350-400° C. In some particular cases, such as the "hot aluminum" process to fulfill the contact hole, a temperature up to 500° C. can be involved. Therefore, the refill materials 35 are preferably thermally stable at a temperature of about 350° C. and above. In exemplary embodiments of the present invention, the refill material 35 can be thermally unstable at a temperature of about 800° C. and above, but thermally stable at a temperature of about 350° C., about 400° C., about 450° C., about 500° C., about 550° C., about 600° C., about 650° C., about 700° C., or about 750° C. In other exemplary embodiments of the present invention, the refill material 35 can be thermally stable at a temperature of about 800° C. and above.

In one embodiment, a thermally unstable organic material, such as a polyimide, other polymer resins, or a combination thereof, is used to refill the trenches 19 using a method of surface reflow or other methods known in the art. A polyimide (PI) is a linear or branched polymer of imide monomers. The glass transition temperature of a polyimide can be higher than 400° C. It has been used for passivation film or metal-metal interlayer for semiconductor devices.

In another embodiment, a thermally stable inorganic material such as a polysilicon, a re-crystallized polysilicon, a single crystal silicon, silicon dioxide, silicon nitride, or a semi-insulating polycrystalline silicon (SIPOS), is used to refill the trenches 19 using a SOG or a CVD (LPCVD) technique known to a person skilled in the art. For example, the trenches 19 can be refilled with SIPOS. The amount of oxygen content in the SIPOS is selectively chosen to be between 2% and 80% to improve the electrical characteristics of the active region. Increasing the amount of oxygen content is desirable for electrical characteristics, but varying the oxygen content also results in altered material properties. Higher oxygen content SIPOS will thermally expand and contract differently than the surrounding silicon which may lead to undesirable fracturing or cracking, especially near the interface of differing materials. Accordingly, the oxygen content of the SIPOS is optimally selected to achieve the most desirable electrical characteristics without an undesirable impact on mechanical properties.

Once the trenches 19 are filled, chemical mechanical polishing (CMP) or other techniques known in the art are performed to planarize the surface 8.

Figure 5:
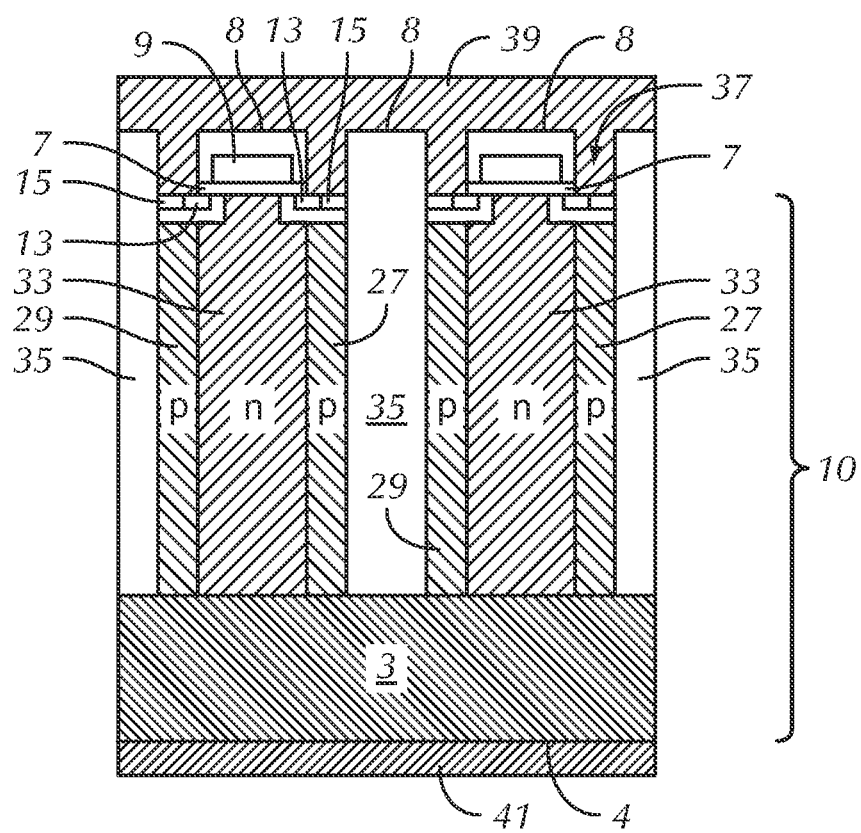
FIG. 5 is an enlarged partial cross-sectional view of the semiconductor substrate after contact hole opening, metal electrode formation, passivation, and backside electrode formation.

FIG. 5 is an enlarged partial cross-sectional view of the semiconductor substrate after contact hole opening, metal electrode formation, passivation, and backside electrode formation. Contact hole openings 37 are formed by removing the ILD deposition at appropriate positions to expose the entire body contact 15 and the partial source 13 at the first main surface 2. Using methods known in the field, metalization is performed to deposit a layer of metal 39 over the contact hole openings 37 and the top surface 8. Passivation is performed using methods known in the field with an appropriate passivation material such as nitride, polyimide, oxide, or PSG. A backside or drain electrode 41 is also provided at the second main surface 4.

Although in certain embodiments the trenches are preferably filled after the steps involving high temperature processes, the process embodiments of the present invention are versatile and no other particular sequence order of the other steps is required. Both thermally stable and unstable refill materials can be used, the n columns and p columns can be exchanged, etc. The different embodiments may be used to make any trench type semiconductor devices, including, but not limited to, a superjunction MOSFET, a superjunction metal-semiconductor field-effect transistor (MESFET), a superjunction Schottky transistor, a superjunction IGBT, a diode, and similar devices.

In another general aspect, embodiments of the present provide a trench type semiconductor device that includes a trench filled with a semi-insulating material and/or an insulating material that is thermally unstable at a temperature of about 800° C. and above but thermally stable at a temperature of about 350° C. and above. In exemplary embodiments of the present invention, the refill material may be thermally unstable at a temperature of about 800° C. and above, but thermally stable at a temperature of about 350° C., about 400° C., about 450° C., about 500° C., about 550° C., about 600° C., about 650° C., about 700° C., or about 750° C.

In exemplary embodiments of the present invention, the trench type device includes a trench filled with a semi-insulating material and/or an insulating material that is thermally unstable at a temperature of above about 350° C., above about 400° C., above about 450° C., above about 500° C., above about 550° C., above about 600° C., above about 650° C., above about 700° C., or above about 750° C. Preferably, embodiments of the present invention provide a trench type superjunction device that includes a trench filled with a semi-insulating material and/or an insulating material that is organic, such as a polyimide.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A method of manufacturing a trench type semiconductor device, the method comprising:
   (i) providing a semiconductor substrate having first and second main surfaces opposite to each other, the semiconductor substrate having a heavily doped region of a first conductivity type at the second main surface and having a lightly doped region of the first conductivity type at the first main surface;
   (ii) forming a terminal structure over the first main surface side, formation of the terminal structure including formation of:
       (a) a gate electrode over the first main surface with a gate insulation layer interposed therebetween,
       (b) a body region of a second conductivity type at the first main surface adjacent to the gate electrode,
       (c) a source region of the first conductivity type in the body region, and
       (d) a body contact of the second conductivity type in the body region adjacent to the source region;
   (iii) after formation of the terminal structure, forming a mesa and a trench in the semiconductor substrate extending from the first main surface, with the terminal structure disposed generally over the mesa, the mesa being adjacent to the trench and having a first sidewall surface and a second sidewall surface;
   (iv) doping, with a dopant of the second conductivity type opposite to the first conductivity type, the first sidewall surface;
   (v) doping, with a dopant of the second conductivity type, the second sidewall surface;
   (vi) driving in the dopant at the first and second sidewall surfaces to respectively form a first doped region of the second conductivity type and a second doped region of the second conductivity; and
   (vii) following steps (i)-(vi), filling the trench with at least one of a semi-insulating material, an insulating material, and a combination thereof.

2. The method of claim 1, wherein the step of filling comprises filling the trench with at least one of a semi-insulating material and an insulating material that is thermally unstable at a temperature of about 800° C. and above.

3. The method of claim 1, wherein the at least one of the semi-insulating material and the insulating material is thermally stable at a temperature selected from the group consisting of about 350° C., about 400° C., about 450° C., about 500° C., about 550° C., about 600° C., about 650° C., about 700° C., and about 750° C.

4. The method of claim 1, wherein the at least one of the semi-insulating material and the insulating material is an organic material.

5. The method of claim 1, wherein the at least one of the semi-insulating material or the insulating material comprises polyimide.

6. The method of claim 1, wherein the step of filling comprises filling the trench with a material selected from the group consisting of a dielectric, undoped polysilicon, doped polysilicon, doped oxide, undoped oxide, silicon nitride, semi-insulating polycrystalline silicon (SIPOS), and a combination thereof.

7. The method of claim 1, further comprising, prior to the step of filling:
(viii) doping, with a dopant of the first conductivity type, the first sidewall surface to form a first doped region of the first conductivity type; and
(ix) doping, with a dopant of the first conductivity type, the second sidewall surface to form a second doped region of the first conductivity type.

8. The method of claim 1 further comprising smoothing the first and the second sidewall surfaces prior to the steps of doping.

9. The method of claim 1 further comprising lining the first and the second sidewall surfaces with at least one of an oxide material and a nitride material, prior to the filling step.

10. The method of claim 1, wherein the driving-in step comprises driving-in the dopant into the first and second sidewall surfaces at a temperature of about 900° C. for about 1 hour.

11. The method of claim 1, wherein the doping step comprises one of ion implantation and diffusion.

12. The method of claim 1, wherein the trench is formed utilizing at least one of plasma etching, reactive ion etching (RIE), sputter etching, vapor phase etching, and chemical etching.

13. The method of claim 1, wherein a plurality of the terminal structures, a plurality of the mesas and a plurality of the trenches are provided.

14. The method of claim 1, wherein steps (i)-(vii) are performed sequentially.

15. The method of claim 1, wherein prior to commencement of each of the steps (i)-(vii), the respective preceding step is substantially completed.

16. The method of claim 1, wherein prior to commencement of each of the step, the preceding step is fully completed.

17. A trench type semiconductor device manufactured according to the method of claim 1.

* * * * *